(12) United States Patent
Doering et al.

(10) Patent No.: US 10,031,562 B2
(45) Date of Patent: Jul. 24, 2018

(54) COOLING ELECTRONIC COMPONENTS AND SUPPLYING POWER TO THE ELECTRONIC COMPONENTS

(71) Applicant: International Business Machines Corporation, Armonk, NY (US)

(72) Inventors: Andreas C. Doering, Zufikon (CH); Ronald P. Luijten, Thalwil (CH); Bruno Michel, Zurich (CH); Stephan Paredes, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 583 days.

(21) Appl. No.: 14/173,233

(22) Filed: Feb. 5, 2014

(65) Prior Publication Data

US 2014/0293533 A1 Oct. 2, 2014

(30) Foreign Application Priority Data

Mar. 28, 2013 (GB) .................................. 1305730.2

(51) Int. Cl.
*G06F 1/20* (2006.01)
*G06F 1/18* (2006.01)
(Continued)

(52) U.S. Cl.
CPC ................ *G06F 1/20* (2013.01); *G06F 1/189* (2013.01); *H05K 7/20509* (2013.01); *H01L 23/473* (2013.01); *H01L 2924/0002* (2013.01)

(58) Field of Classification Search
CPC ....... G06F 1/20; G06F 1/189; H05K 7/20509; H05K 1/0272; H05K 1/144; H05K 1/142;
(Continued)

(56) References Cited

U.S. PATENT DOCUMENTS 4,628,407 A * 12/1986 August .................. H01L 23/36
257/E23.101
5,371,653 A * 12/1994 Kametani ............. H01L 23/467
174/252

(Continued)

OTHER PUBLICATIONS

Oliver, Stephen, "From the 380V DC Bus to sub-1V Processors: Efficient Power Conversion Solutions", V-I Chip Inc., Supercomputing 2007, Reno, Nevada, Nov. 14, 2007, 21 pages.

*Primary Examiner* — Jayprakash N Gandhi
*Assistant Examiner* — Stephen Sul
(74) *Attorney, Agent, or Firm* — Francis Lammes; Stephen J. Walder, Jr.; Mercedes L. Hobson

(57) ABSTRACT

A mechanism is provided for cooling electronic components of a printed circuit board module and for supplying power to the electronic components of the printed circuit board module. The computer module comprises a printed circuit board module, wherein the electronic components are attached to a first side of the printed circuit board module, and a cooling module being attached to a second side of the printed circuit board, being arranged in parallel to the printed circuit board and having a first layer being thermally and electrically conductive. The first layer is arranged such that heat is dissipated from the printed circuit board module and that power from a power source is supplied to the electronic components of the printed circuit board module.

15 Claims, 5 Drawing Sheets

(51) Int. Cl.
*H05K 7/20* (2006.01)
*H01L 23/473* (2006.01)

(58) Field of Classification Search
CPC ............... H05K 1/0293; H05K 1/0263; H05K 1/0201–1/0213; H01L 23/473; H05R 12/732; H01R 12/732
USPC ..... 361/679.53, 679.54, 689, 697, 699, 702, 361/707, 709, 712, 719–721, 790, 794, 361/792; 174/252
See application file for complete search history.

(56) References Cited

U.S. PATENT DOCUMENTS

| | | | |
|---|---|---|---|
| 5,574,630 A * | 11/1996 | Kresge | H01L 23/49861 174/255 |
| 6,711,030 B2 * | 3/2004 | Akiba | H05K 3/368 174/262 |
| 6,801,431 B2 | 10/2004 | Hartke et al. | |
| 7,133,287 B2 | 11/2006 | Campini et al. | |
| 8,208,253 B1 * | 6/2012 | Goergen | H05K 7/1445 342/175 |
| 8,913,391 B2 * | 12/2014 | Ling | H05K 7/20545 165/185 |
| 2002/0057554 A1 | 5/2002 | Dibene, II et al. | |
| 2002/0163781 A1 * | 11/2002 | Bartola | H01L 23/473 361/699 |
| 2006/0109629 A1 | 5/2006 | Harris et al. | |
| 2006/0133042 A1 | 6/2006 | Belady et al. | |
| 2008/0198555 A1 * | 8/2008 | Yamashita | H01L 23/4006 361/712 |
| 2009/0185352 A1 * | 7/2009 | Ellsworth | H05K 1/0204 361/720 |
| 2012/0105144 A1 * | 5/2012 | Barowski | H01L 25/0657 327/565 |
| 2012/0106074 A1 | 5/2012 | Baroski et al. | |
| 2012/0314375 A1 * | 12/2012 | Sato | H05K 1/0204 361/720 |

* cited by examiner

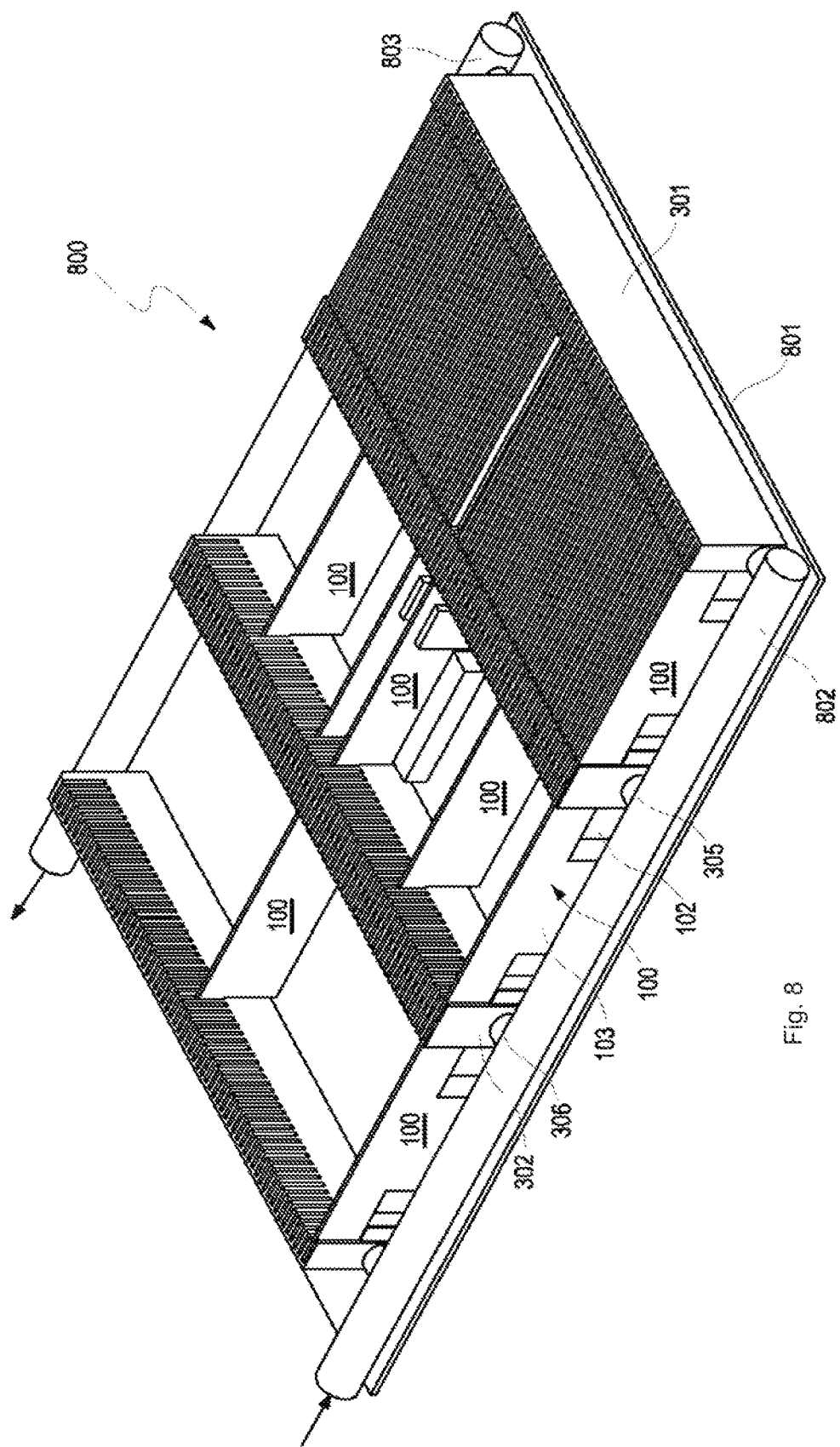

COOLING ELECTRONIC COMPONENTS AND SUPPLYING POWER TO THE ELECTRONIC COMPONENTS

BACKGROUND

The invention relates to a device and to a method for cooling electronic components and for supplying power to the electronic components via the same module.

Computer systems comprise a plurality of single printed circuit boards (PCB) which may be arranged on a common backplane. Such PCBs may comprise different components like processors, memories or power converters. The PCBs comprising the components may also be called modules and may be processor modules, power converter modules or I/O modules, for example. Increasing the computational power, memory bandwidth and capacity or I/O bandwidth of such computer systems may result in an increase of the power consumption of the single modules. Such an increase of power consumption may lead to an increase of energy to be supplied to the system and distributed within the system to the single modules. However, this leads to an increase of heat in the modules, which heat needs to be removed.

Document U.S. Pat. No. 7,133,287 A1 shows an integrated heat sink and core power distribution mechanism. First and second power rails are disposed on opposite sides of one of more integrated circuits on a printed circuit board (PCB). The power rails are electrically coupled to a power supply and the integrated circuits. At the same time, the power rails are used to thermally couple one or more heat sinks to the integrated circuit(s).

Further, US 20120106074 A1 or U.S. Pat. No. 6,801,431 A1 disclose arrangements for dissipating heat and for supplying power via separate elements.

However, in order to remove or dissipate the increasing heat from modules, there is a need for an improved dissipation of heat and for a supply of power at the same time via the same elements.

SUMMARY

According to a first aspect, a computer module for cooling electronic components of a printed circuit board module and for supplying power to the electronic components of the printed circuit board module is suggested. The computer module comprises a printed circuit board module, wherein electronic components are attached to a first side of the printed circuit board module, and a cooling module being attached to a second side of the printed circuit board, being arranged in parallel to the printed circuit board and having a first layer being thermally and electrically conductive. The first layer is arranged such that heat is dissipated from the printed circuit board module and that power from a power source is supplied to the electronic components of the printed circuit board module.

According to a second aspect, a modular computer system is suggested. The modular computer system comprises a plurality of computer modules as described above being arranged on a back plane, where one or more electronic components are coupled to a first side of each computer module in the plurality of computer modules. The modular computer system further comprises a cooling module coupled to a second side of each computer module in the plurality of computer modules thereby forming a plurality of cooling modules, where the cooling modules having a first layer being thermally and electrically conductive, where the first layer is arranged such that heat is dissipated from the associated computer module and that power from a power source is supplied to the one or more electronic components of each computer module. The modular computer system further comprises a cooling system for dissipating heat from the plurality of cooling modules that are dissipating heat from the plurality of computer modules.

According to a third aspect, a method for cooling electronic components of a printed circuit board module and for supplying power to the electronic components of the printed circuit board module is suggested. Electronic components are attached to a first side of the printed circuit board module, and a cooling module is attached to a second side of the printed circuit board module, is arranged in parallel to the printed circuit board module and has a first layer being thermally and electrically conductive. The method comprises dissipating, by the cooling module, heat from the printed circuit board module via the first layer, and supplying, by the cooling module, power from a power source to the electronic components of the printed circuit board module via the first layer.

In the following, exemplary embodiments of the present invention are described with reference to the enclosed figures.

BRIEF DESCRIPTION OF THE SEVERAL VIEWS OF THE DRAWINGS

FIG. 8 shows a perspective view of the embodiment of the modular computer system comprising a plurality of computer modules for cooling electronic components of a printed circuit board module and for supplying power to the electronic components of the printed circuit board module.

Similar or functionally similar elements in the figures have been allocated the same reference signs if not otherwise indicated.

DETAILED DESCRIPTION

Figure 1:
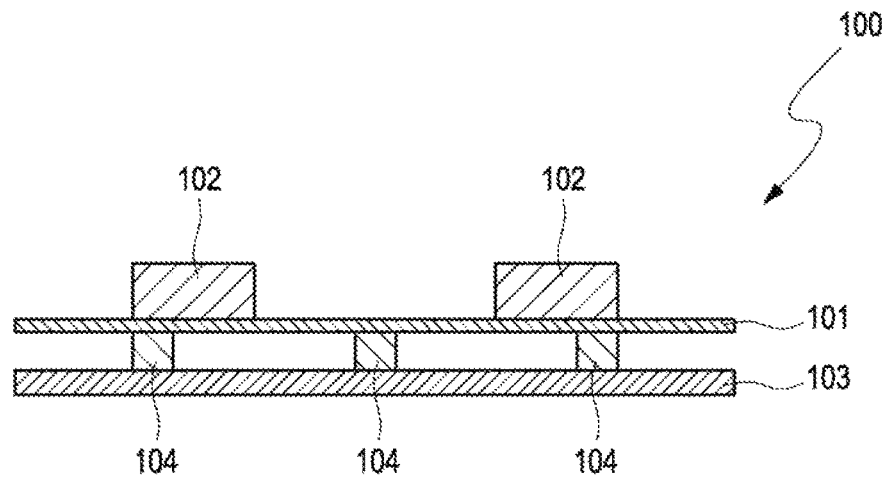
FIG. 1 shows a schematic cross-sectional view of a first embodiment of a computer module for cooling electronic components of a printed circuit board module and for supplying power to the electronic components of the printed circuit board module.

According to a first aspect, a computer module for cooling electronic components of a printed circuit board module and for supplying power to the electronic components of the printed circuit board module is suggested. The computer module comprises a printed circuit board module, wherein electronic components are attached to a first side of the printed circuit board module, and a cooling module being attached to a second side of the printed circuit board, being arranged in parallel to the printed circuit board and having a first layer being thermally and electrically conductive. The first layer is arranged such that heat is dissipated from the printed circuit board module and that power from a power source is supplied to the electronic components of the printed circuit board module.

The printed circuit board (PCB) module may be a processor module, power converter module, I/O module or the like being used in a computer system. The PCB module comprises electronic components like memories, resistors, capacitors, processors or power converters. Each PCB module may need a sufficient amount of power for proper functioning. The power may be supplied via the cooling module. During operation of the components, power may be consumed and heat may be generated. Thus, in addition to supplying power to the components, the cooling module also works as a heat spreader dissipating heat from the PCB module and its components. As the cooling module is arranged in parallel to the PCB module, heat may be dissipated from the complete PCB module.

The first layer may be made of a material being able to supply power and to dissipate heat. The material may be a metal material like copper or aluminium. The first layer may be used as main power supply for the components. The power may be forwarded from a power source of the overall system, which may be a computer system.

In one embodiment, the components of the PCB module require very low supply voltage (for instance 1V or tower). In this case, a power converter may be added to the plurality of electronic components and may be used for converting the delivered power into the low supply voltage for the components. Such a power converter may be attached on a first side of the PCB module, e.g. which side faces the cooling module in a manner that there exists a direct contact between the power converter and the cooling module—thermally connected but electrically isolated. The other electronic components of the PCB module may be arranged on a second side of the PCB module opposite the first side. There may be a thermal bridge between the second side of the PCB module and the cooling module in order to cool the components being arranged on the second side of the PCB module.

In a further embodiment, the material of the first layer provides a low electrical resistance, e.g. like metal. In this case, the first layer may allow a higher current and thus lower supply voltage. This may result in a higher efficiency of the power converter. Further, the lower supply voltage (for instance 12V) may reduce risks and isolation requirements of the computer module compared to computer modules requiring higher voltages (for instance 48V or higher).

In a further embodiment, the cooling module has a second layer being thermally and electrically conductive, wherein the second layer is arranged such that heat is dissipatable from the printed circuit board module and that aground connection is (providable to the electronic components of the printed circuit board module.

Both layers may be used for dissipating heat from the PCB module. The first layer may be connected to a power supply for supplying power to the PCB module and the second layer may be connected to a ground contact of the overall system for providing ground potential to the PCB module. Without the second layer, a ground connection may be provided by another contact between the PCB module and ground. According to this embodiment, a multi-layered heat spreader may be provided by the cooling module 103.

In a further embodiment, the first layer and the second layer are electrically isolated to each other and thermally connected.

The electrical isolation may be achieved by using an isolation layer between the first layer and the second layer. The isolation layer may be for instance a thermal interface material having a low thermal resistance value.

In a further embodiment, the first layer and the second layer are arranged adjacently to each other in a plane parallel to the printed circuit board module.

According to this embodiment, the first layer and the second layer do not overlap. For instance, the First layer may be arranged on a left part of the PCB module and the second layer may be arranged on a right part of the PCB module.

In one embodiment, a power converter may be arranged between the two layers. This arrangement may provide a low height of the computer module as the power converter is arranged between the cooling module and not on top of the cooling module. The heat extraction may be asymmetric as the insulation between the layers interferes with the thermal path. In this embodiment, a ground connection to external ground may be provided on the one side of the PCB module and a power supply connection to the power source may be provided on the other side of the PCB module.

In a further embodiment, the first layer and the second layer are arranged on top of each other in a plane parallel to the printed circuit board module.

In particular, the first layer and the second layer may have equal or at least similar lateral dimensions. This arrangement may provide a mechanical support for the PCB module and may further provide a lower electromagnetic interference. The heat extraction may be symmetric, i.e., heat may be dissipated to both sides of the PCB in an equal amount.

In a further embodiment, the cooling module has a third layer being thermally and electrically conductive, wherein the third layer is arranged such that heat is dissipatable from the printed circuit board module and that aground connection is providable to the electronic components of the printed circuit board module, and wherein the first layer is arranged between the second layer and the third layer.

The first layer, the second layer and the third layer may provide a sandwich structure. The sandwich structure may improve the mechanical support for the PCB module. For the fabrication of the cooling module, a lamination process with thermal optimized dielectrics may be used.

In a further embodiment, the cooling module is attached to the printed circuit board module via attachment means serving as electrical connections between the cooling module and the printed circuit board module.

Connections between ground contacts of the PCB module and the second layer and between contacts of the PCB module requiring power and the first layer may be achieved by using attachment means. The attachment means thus provide a multiple function.

In a further embodiment, the attachment means are rivet elements and/or spring elements.

Also any other kind of attachment means may be used. Using rivet elements, the PCB module and the cooling module may be permanently connected. Using spring elements, the PCB module and the cooling module may be attached together and may be removed from each other. A stiff fixture between the PCB module and the cooling module, e.g. using rivets, allows the use of the cooling module as mechanic rigid element of the assembly or computer module. Decoupling these functions, i.e. decoupling the mechanical and electrical functions of the PCB module, may allow the use of other technologies for the PCB fabrication, like laminate, semi-flex or flex, thereby increasing the electrical interconnection capacity of the PCB module.

In a further embodiment, end sections of the cooling module extend beyond the printed circuit board module in length. The end sections may be used for connecting the cooling module to any kind of external elements, i.e. elements being not part of the computer module.

In a further embodiment, the end sections of the cooling module are connected to a heat sink.

The heat sink may be actively or passively cooled. The heat sink may provide a dissipation of heat and may also provide contacts to ground and/or to a power source.

According to a second aspect, a modular computer system is suggested. The modular computer system comprises a plurality of computer modules as described above being arranged on a back plane, where one or more electronic components are coupled to a first side of each computer module in the plurality of computer modules. The modular computer system further comprises a cooling module coupled to a second side of each computer module in the plurality of computer modules thereby forming a plurality of cooling modules, where the cooling modules having a first layer being thermally and electrically conductive, where the first layer is arranged such that heat is dissipated from the associated computer module and that power from a power source is supplied to the one or more electronic components of each computer module. The modular computer system further comprises a cooling system for dissipating heat from the plurality of cooling modules that are dissipating heat from the plurality of computer modules.

The backplane may comprise a plurality of connectors in which the PCB modules of the computer modules can be inserted. The connectors may be soldered on the backplane and may provide a small amount of power. The backplane represents a main module having a plurality of computer modules. The cooling system may provide heat dissipation from the cooling modules, wherein each cooling module is connected to the cooling system.

In an embodiment, the cooling system has heat sinks being connected to end sections of the cooling modules.

As described above, the cooling modules of the computer modules may comprise end sections. These end sections may be connected to the cooling system, in particular to heat sinks of the cooling system.

In a further embodiment, the cooling system has cooling pipes being arranged for receiving and dissipating heat from the heat sinks.

The cooling pipes may be separated from the heat sinks or may be integrated in the heat sinks. The cooling pipes may comprise a cooling liquid, which is adapted to receive heat from the heat sinks and to transport the heat away from the heat sinks. The cooling pipes may be connected to a main cooling system of the computer system which may be an active cooled system.

In a further embodiment, the cooling system is arranged between the plurality of computer modules and/or on top of the plurality of computer modules.

The computer modules may be arranged in rows and columns. In one embodiment, the cooling system, for instance the heat sinks, may be arranged between the columns of computer modules. In another embodiment, the cooling system may be arranged on top of the arrangement of computer modules.

According to a third aspect, a method for cooling electronic components of a printed circuit board module and for supplying power to the electronic components of the printed circuit board module is suggested. Electronic components are attached to a first side of the printed circuit board module, and a cooling module is attached to a second side of the printed circuit board module, is arranged in parallel to the printed circuit board module and has a first layer being thermally and electrically conductive. The method comprises dissipating, by the cooling module, heat from the printed circuit board module via the first layer, and supplying, by the cooling module, power from a power source to the electronic components of the printed circuit board module via the first layer.

In FIG. 1, a first embodiment of a computer module 100 is shown in a cross-sectional view. The computer module 100 comprises a printed circuit board (PCB) module 101. On top of this PCB module 101, several electronic components 102 are attached. A cooling module 103 is attached to the PCB module 101, for instance via attachment means 104. The cooling module 103 provides a heat dissipation and a delivery of power to the PCB module 101 and thus to the electronic components 102. For this purpose, the cooling module 103 comprises at least one layer, which is further explained in FIG. 2.

The cooling module 103 is arranged in parallel to the PCB module 101. In the embodiment of FIG. 1, the cooling module 103 has the same lateral dimensions as the PCB module 101. The cooling module 103 may also extend beyond the PCB module 101 which wilt be shown later.

Figure 2:
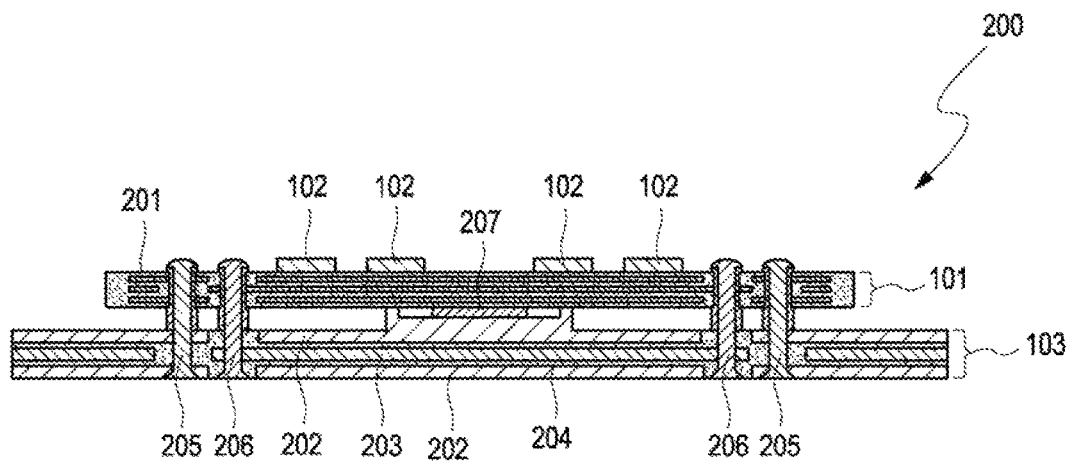
FIG. 2 shows a cross-sectional view of a second embodiment of a computer module for cooling electronic components of a printed circuit board module and for supplying power to the electronic components of the printed circuit board module.

FIG. 2 shows a cross-sectional view of a second embodiment of a computer module 200. The cooling module 103 comprises a sandwich structure of layers 202 and 203. The first layer 203 provides power to the PCB module 101, in particular to the electronic components 102 and an IC (for instance a power chip) 207. The IC 207 may be in direct contact with the cooling module 103 in order to improve the heat dissipation from the IC 207. The cooling module 103 comprises a second layer 202 and a third layer 202. These layers may provide a ground connection. The sandwich structure of layers 202, 203 dissipate at the same time heat from the PCB module 101 (to the left side and the right side of FIG. 2). An electrical isolation is provided between the first layer 203, the second layer 202 and the third layer 202 by using isolation layer 204 between the layers 202, 203. The isolation layer 204 may also provide isolation against attachment means 205, 206.

The cooling module 103 is connected to the PCB module 101 via attachment means 205, 206. Attachment means 205 are used to provide a ground connection from the second layer 202 and the third layer 202 to the PCB module 101. Attachment means 206 are used to provide a connection for delivering or supplying power from the first layer 203 to the PCB module 101. The PCB module 101 comprises different traces 201 for connecting the electronic components 102 and IC 207 with power or ground via the attachment means 205, 206 and via the first layer 203, the second layer 202 and the third layer 202.

Figure 3:
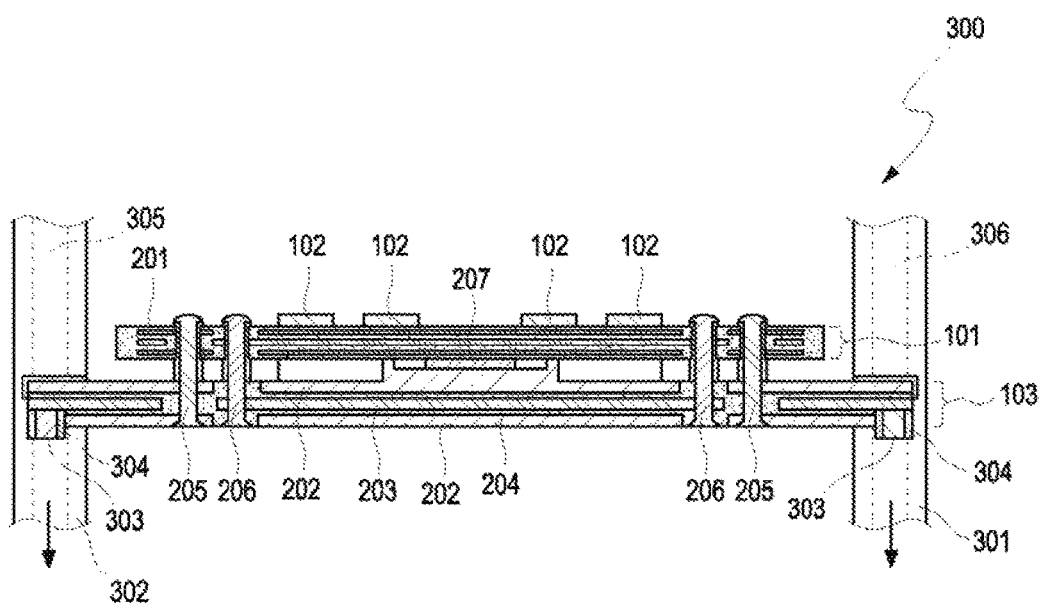
FIG. 3 shows a cross-sectional view of the second embodiment of the computer module being connected to a heat sink.

The end sections of the cooling module 103, which extend beyond the PCB module 101, can be connected to a heat sink 301, 302 as shown in FIG. 3 which shows the embodiment 300 of FIG. 2 with a heat sink connection. The heat sink 301, 302 may comprise different parts for ground connection 304 and power connection 303. The first layer 203 is connected to the power connection part 303. The second layer 202 and the third layer 202 are connected to the ground connection 304.

One side of the cooling module 103 is connected to a heat sink 301. The other side of the cooling module 103 is connected to a heat sink 302. Each heat sink 301, 302 (or one of them) may comprise a pipe 305, 306. A fluid (for instance water) can be led inside the pipes 305, 306 for removing heat from the heat sinks 301, 302. The fluid is led with a temperature Tin into the pipe 305, 306 and exits the pipe 305, 306 with a temperature Tout. The temperature Tout is greater than the temperature Tin, as the heat from the heat sinks 301, 302 heats the fluid.

Figure 4:
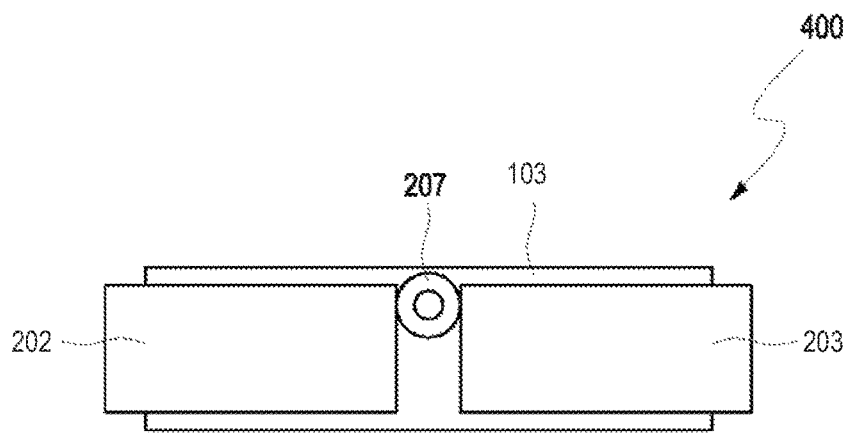
FIG. 4 shows a schematic side view of a third embodiment of a computer module for cooling electronic components of a printed circuit board module and for supplying power to the electronic components of the printed circuit board module.

FIG. 4 shows a schematic side view of a third embodiment of a computer module 400. Instead of a first layer 202 and a second layer 203 being arranged in parallel to each other, the layers 202 and 203 of the cooling module 103 are arranged adjacent to each other. In the middle between the layers 202 and 203, the IC 207 may be arranged. The IC 207 may be a power converter. The first layer 202 is connected to a power source and the second layer 203 is connected to ground.

Figure 5:
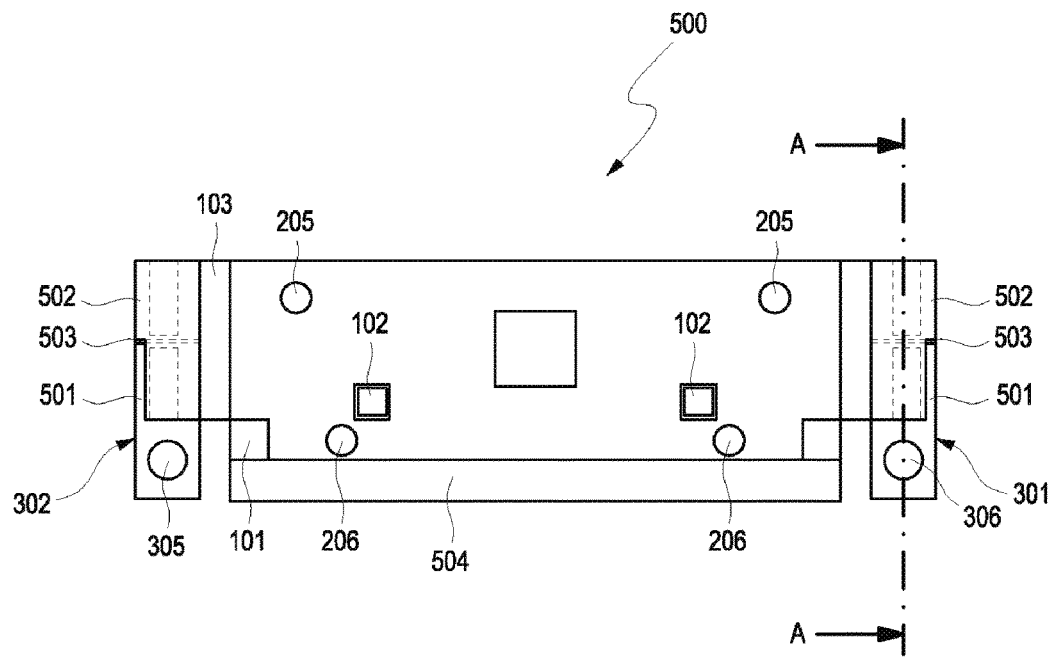
FIG. 5 shows amide view of a fourth embodiment of a computer module for cooling electronic components of a printed circuit board module and for supplying power to the electronic components of the printed circuit board module.

FIG. 5 shows a side view of a fourth embodiment of a computer module 500 for cooling electronic components 102 of a printed circuit board module 101 and for supplying power to the electronic components 102 of the printed circuit board module 101. The cooling module 103 is connected to heat sinks 301, 302.

The heat sinks 301, 302 have a first part 501 providing a ground connection and a second part 502 providing an electrical connection to a power source. The first part 501 has a greater profile or cross-section than the second part 502. The first part 501 and the second part 502 are isolated against each other by an isolation layer 503. Again, each heat sink 301, 302 may comprise a pipe 306, 305, respectively. A fluid (for instance water) can be led inside the pipes 306, 305 for removing heat from the heat sinks 301, 302.

As shown in FIG. 5, the computer module 100 can be inserted into a connector 504. The connector 504 can be arranged on a backplane 701 as shown in FIG. 7.

The cooling module 103 can be attached to the PCB module 101 via attachment means 205, 206. These attachment means 205, 206 can be rivets. In another embodiment, the attachment means 205, 206 can be spring elements.

Figure 6:
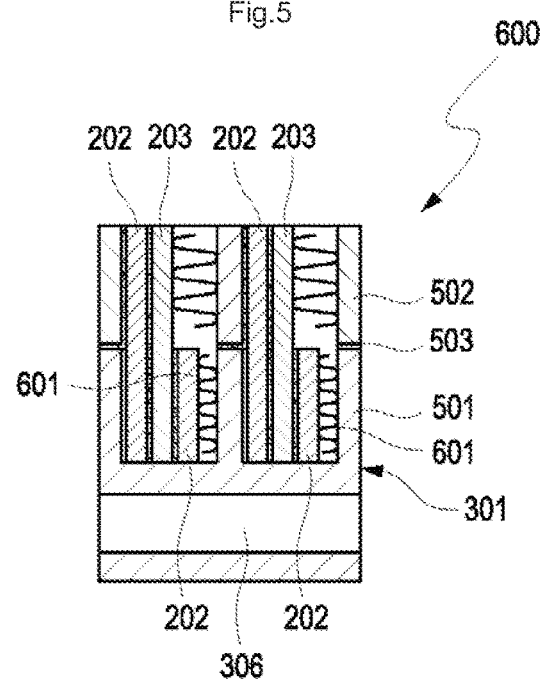
FIG. 6 shows a cross-sectional view of a fifth embodiment of a computer module for cooling electronic components of a printed circuit board module and for supplying power to the electronic components of the printed circuit board module having spring elements.

In addition, the cooling module 1103 can be attached to the heat sinks 301 via spring elements 601 as shown in FIG. 6. In FIG. 6, a cross-sectional view of a computer module 600 is shown. The cross-section is shown along line A-A of FIG. 5, The spring elements 601 can be used for providing a proper electrical contact between the cooling module 103, i.e., the first layer 203 and the second layer 202, and the heat sink 302. The spring elements 601 can also be used to provide a good thermal contact between the cooling module 103 and the heat sink 302. Heat sink 301 may comprise a pipe 306, in which a fluid (for instance water) can be led inside the pipe 306 for removing heat from the heat sink 301.

Figure 7:
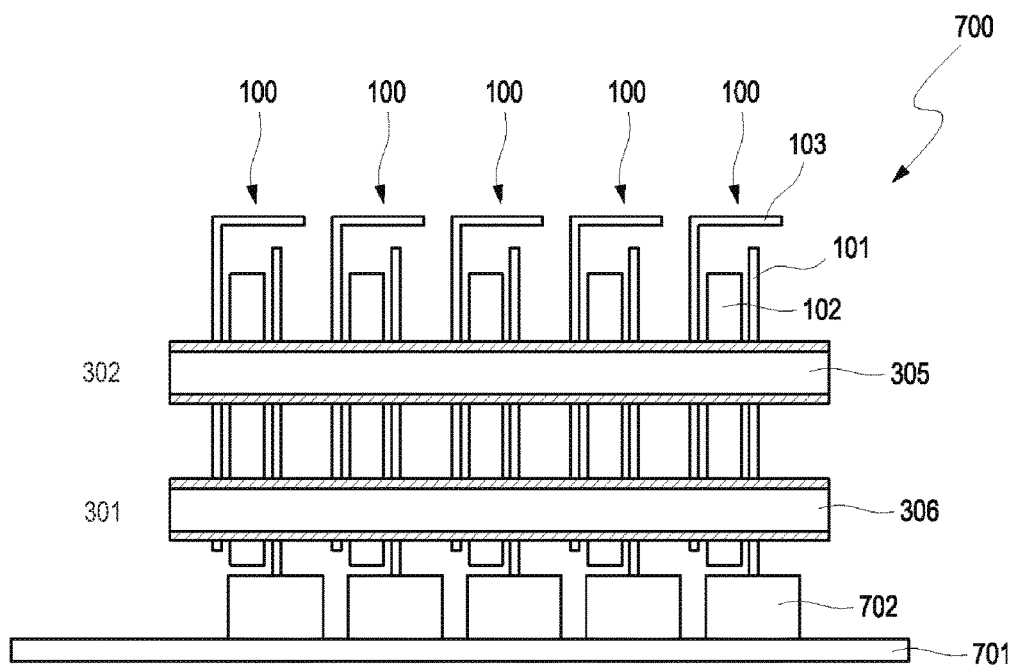
FIG. 7 shows a schematic side view of an embodiment of a modular computer system comprising a plurality of computer modules for cooling electronic components of a printed circuit board module and for supplying power to the electronic components of the printed circuit board module.

A plurality of computer modules 100 may be attached to a backplane 701 for a modular computer system 700 as shown in FIG. 7. A plurality of connectors 702 can be arranged on the backplane 701. The connectors 702 can be arranged in a pattern of rows and columns. In each connector 702, a computer module 100 can be inserted as shown, such that the PCB module 101 is connected to connector 702 with electronic components 102 between PCB module 101 and cooling module 103. The pipes 305, 306 can be arranged at different heights of the computer modules 100. As shown in FIG. 7, the cooling module 103 can be bent over the top of the computer modules 100. By such an arrangement, it can be achieved that electromagnetic radiation is reduced or eliminated. The computer modules 100 can produce such electromagnetic radiation. Further, cooling can also be improved with a contact to a top cooling plate (not shown) taking advantage of a shorter thermal path between IC 207 and heat sink 301, 302.

FIG. 8 shows a perspective view 800 of the embodiment of the modular computer system 700 comprising a plurality of computer modules 100. On the backplane 801, a plurality of connectors 702 is arranged (not shown in FIG. 8). The computer modules 100 are inserted in the connectors 702. The computer modules 100 can be different kind of computer modules 100 serving different purposes.

Between the columns of computer modules 100, heat sinks 301, 302 are arranged. The cooling modules 103 are attached to the heat sinks 301, 302. As shown, the heat sinks 301, 302 comprise recesses and the cooling modules 103 are inserted into the recesses of the heat sinks 301, 302 in a comb-like manner.

Pipes 305, 306 are part of the heat sinks 301, 302. The pipes 305, 306 of the heat sinks 301, 302 are connected to main pipes 802, 803. These main pipes 802, 803 transfer coot fluid, like water, from one side through the main pipe 802, subsequently the pipes 305, 306, and then through the main pipe 803. Arrows indicate the inlet and outlet of the cooing fluid.

It should be noted that not all computer modules 100 are shown having a cooling module 103. However, all computer modules 100 can comprise such a cooling module 103. Further, as can be seen in FIG. 8, the backplane 801 might be only partially with computer modules 100. The distance between the computer modules 100 can be very small, for instance some millimeter. By using the cooling module 103 as described herein, the heat produced by the electronic components 102 can be dissipated from the computer modules 100 in an efficient manner.

Figure 9:
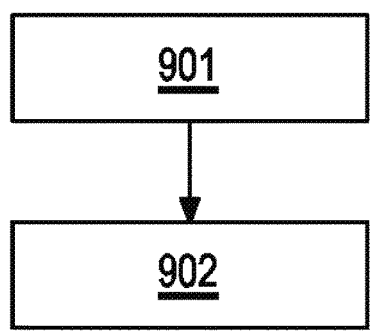
FIG. 9 shows a schematic block diagram of a method for cooling electronic components of a printed circuit board module and for supplying power to the electronic components of the printed circuit board.

FIG. 9 shows a schematic block diagram of a method for cooling electronic components of a printed circuit board module and for supplying power to the electronic components of the printed circuit board.

In a first step 901, heat is dissipated from the PCB module 101 and thus from the computer module 100 via the first layer 202 of the cooling module 103. In a second step 902, power is supplied from a power source to the electronic components 102 of the PCB module 101 via the first layer 202. The first step 901 and the second step 902 may be carried out at the same time. The steps may also vary in their order, i.e., the second step 902 may be carried out before the first step 901.

As will be appreciated by one skilled in the art, aspects of the present. invention may be embodied as a system or method. Although some of the features have been described with respect to the system and some of the features have been described with respect to the method, it will be understood that features of the system may also be applied to the method and vice versa.

More generally, while the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the appended claims.

The invention claimed is:

1. A computer module for cooling electronic components of a printed circuit board module and for supplying power to the electronic components of the printed circuit board module, the computer module comprising:
   the printed circuit board module, wherein the electronic components are attached to a first side of the printed circuit board module, and
   a cooling module being attached to a second side of the printed circuit board module and being arranged in parallel to the printed circuit board module wherein the cooling module has:
      a first layer being thermally and electrically conductive, wherein the first layer is arranged such that heat is dissipated from the printed circuit board module to the first layer via a first attachment means and wherein power from a power source is supplied to the electronic components on the first side of the printed circuit board module from the first layer via the first attachment means,
      a second layer being thermally and electrically conductive, wherein the second layer is arranged such that heat is dissipated from the printed circuit board module to the second layer via a second attachment means and wherein a ground connection is provided to the electronic components on the first side of the printed circuit board module from the second layer via the second attachment means, and
      end sections that extend beyond the printed circuit board module in length and are connected to a heat sink such that the heat dissipated from the printed circuit board module to the first layer and the heat dissipated from the printed circuit board module to the second layer is dissipated further to the heat sink via the end sections.

2. The computer module of claim 1, wherein the first layer and the second layer are electrically isolated from each other and thermally connected.

3. The computer module of claim 1, wherein the first layer and the second layer are arranged adjacently to each other in a plane parallel to the printed circuit board module.

4. The computer module of claim 1, wherein the first layer and the second layer are arranged on top of each other in a plane parallel to the printed circuit board module.

5. The computer module of claim 4, wherein the cooling module has a third layer being thermally and electrically conductive, wherein the third layer is arranged such that heat is dissipated from the printed circuit board module to the third layer via the second attachment means, wherein an additional ground connection is provided to the electronic components on the first side of the printed circuit board module from the third layer via the second attachment means, and wherein the first layer is arranged between the second layer and the third layer.

6. The computer module of claim 1, wherein the attachment means are rivet elements or spring elements.

7. A modular computer system, comprising:
   a plurality of computer modules being arranged on a back plane, wherein one or more electronic components are coupled to a first side of each computer module in the plurality of computer modules,
   a cooling module coupled to a second side of each computer module in the plurality of computer modules thereby forming a plurality of cooling modules, wherein each cooling module of the plurality of cooling modules has:
      a first layer being thermally and electrically conductive, wherein the first layer is arranged such that heat is dissipated from the associated computer module to the first layer via a first attachment means and wherein power from a power source is supplied to the one or more electronic components on the first side of the associated computer module from the first layer via the first attachment means,
      a second layer being thermally and electrically conductive, wherein the second layer is arranged such that heat is dissipated from the associated computer module to the second layer via a second attachment means and wherein a ground connection is provided to the one or more electronic components on the first side of the associated computer module from the second layer via the second attachment means, and
      end sections that extend beyond the printed circuit board module in length, and
   a cooling system for dissipating heat from the plurality of cooling modules that are dissipating heat from the plurality of computer modules, wherein in the cooling system is at least one heat sink that is connected to the end sections of the plurality of cooling modules such that the heat dissipated from the associated computer module to the first layer and the heat dissipated from the associated computer module to the second layer is dissipated to the at least one heat sink via the end sections.

8. The modular computer system of claim 7, wherein the cooling system has one or more heat sinks being connected to end sections of the plurality of cooling modules.

9. The modular computer system of claim 8, wherein the cooling system has one or more cooling pipes being arranged for dissipating heat from the one or more heat sinks.

10. The modular computer system of claim 7, wherein the cooling system is arranged between the plurality of computer modules or on top of the plurality of computer modules.

11. A method for cooling electronic components of a printed circuit board module and for supplying power to the electronic components of the printed circuit board module, wherein the electronic components are attached to a first side of the printed circuit board module, and wherein a cooling module attached to a second side of the printed circuit board module is arranged in parallel to the printed circuit board module and has a first layer being thermally and electrically conductive, a second layer being thermally and electrically conductive, and end sections that extend beyond the printed circuit board module in length and are connected to a heat sink, the method comprising:

dissipating, by the cooling module, heat from the printed circuit board module to the first layer via a first attachment means, supplying, by the cooling module, power from a power source to the electronic components on the first side of the printed circuit board module from the first layer via the first attachment means, dissipating, by the cooling module, heat from the printed circuit board module to the second layer via a second attachment means, providing, by the cooling module, a ground connection to the electronic components on the first side of the printed circuit board module from the second layer via the second attachment means, and dissipating, by the heat sink, the heat dissipated from the printed circuit board module to the first layer and the heat dissipated from the printed circuit board module to the second layer via the end sections.

12. The method of claim 11, wherein the first layer and second layer are electrically isolated from each other and thermally connected.

13. The method of claim 11, wherein the first layer and the second layer are arranged adjacently to each other in a plane parallel to the printed circuit board module.

14. The method of claim 11, wherein the first layer and the second layer are arranged on top of each other in a plane parallel to the printed circuit board module.

15. The method of claim 14, wherein the cooling module has a third layer being thermally and electrically conductive, wherein the method further comprises:

dissipating, by the cooling module, heat from the printed circuit board module to the third layer via the second attachment means, and providing, by the cooling module, an additional ground connection to the electronic components on the first side of the printed circuit board module from the third layer via the second attachment means, wherein the first layer is arranged between the second layer and the third layer.

* * * * *